(12) United States Patent
Aoki et al.

(10) Patent No.: US 12,417,909 B2
(45) Date of Patent: Sep. 16, 2025

(54) SURFACE PROCESSING APPARATUS AND SURFACE PROCESSING METHOD FOR SiC SUBSTRATE

(71) Applicant: DENSO CORPORATION, Kariya (JP)

(72) Inventors: Kazufumi Aoki, Kariya (JP); Naoki Maruno, Kariya (JP); Bahman Soltani, Kariya (JP); Yuya Kato, Kariya (JP); Kyohei Kotake, Kariya (JP); Shinji Mukota, Kariya (JP); Manabu Tomisaka, Kariya (JP); Yasuo Ishihara, Kariya (JP); Shusaku Nakazawa, Kariya (JP); Tetsuji Yamaguchi, Kariya (JP)

(73) Assignee: DENSO CORPORATION, Kariya (JP)

( * ) Notice: Subject to any disclaimer, the term of this patent is extended or adjusted under 35 U.S.C. 154(b) by 360 days.

(21) Appl. No.: 17/750,450

(22) Filed: May 23, 2022

(65) Prior Publication Data

US 2022/0384185 A1  Dec. 1, 2022

(30) Foreign Application Priority Data

May 25, 2021 (JP) .................. 2021-087582

(51) Int. Cl.
*H01L 21/02* (2006.01)
*H01L 21/30* (2006.01)
*H01L 21/304* (2006.01)

(52) U.S. Cl.
CPC .. *H01L 21/02258* (2013.01); *H01L 21/02013* (2013.01); *H01L 21/304* (2013.01)

(58) Field of Classification Search
CPC ......... H01L 21/02013; H01L 21/02258; H01L 21/304; H01L 21/306; H01L 21/3063

(Continued)

(56) References Cited

U.S. PATENT DOCUMENTS 4,405,421 A * 9/1983 Inoue ................. B23H 5/08
205/663
2006/0169597 A1 8/2006 Liu et al.
(Continued)

FOREIGN PATENT DOCUMENTS

CN    110197789 A    9/2019
JP    2010-251699 A    11/2010
(Continued)

OTHER PUBLICATIONS

Murata Junji et al: "Polishing-pad-free electrochemical mechanical polishing of single-crystalline SiC surfaces using plyurethane-CeO₂ core-shell particles," International Journal of Machine Tools and Manufacture, vol. 114, Nov. 26, 2016 (Nov. 26, 2016), pp. 1-7, XP 055974287.

(Continued)

*Primary Examiner* — Monica D Harrison
(74) *Attorney, Agent, or Firm* — Harness, Dickey & Pierce, P.L.C.

(57) ABSTRACT

Provided is a surface processing apparatus and a surface processing method for a SiC substrate using anodization. The surface processing apparatus for the SiC substrate includes a surface processing pad and a power supply device. The surface processing pad includes a grinding wheel layer. The grinding wheel layer is disposed facing a workpiece surface of the SiC substrate. The power supply device passes a pulsed current having a period greater than 0.01 seconds and less than or equal to 20 seconds for anodizing the workpiece surface to be processed by the grinding wheel layer through the SiC substrate as an anode in the presence of an electrolyte.

8 Claims, 5 Drawing Sheets

(58) Field of Classification Search
USPC .......................................................... 438/769
See application file for complete search history.

(56) References Cited

U.S. PATENT DOCUMENTS

| | | |
|---|---|---|
| 2012/0001193 A1 | 1/2012 | Sano et al. |
| 2020/0058482 A1* | 2/2020 | Toujinbara ........ H01L 21/02005 |

FOREIGN PATENT DOCUMENTS

| | | |
|---|---|---|
| JP | 2013-040373 A | 2/2013 |
| JP | 2014-187131 A | 10/2014 |
| JP | 2014-203990 A | 10/2014 |
| JP | 2015-211047 A | 11/2015 |
| JP | 2017-028162 A | 2/2017 |
| JP | 2017-092497 A | 5/2017 |
| JP | 2021-027359 A | 2/2021 |

OTHER PUBLICATIONS

Murata Junji et al: "Investigation of Electrolytic Condition on Abrasive-Free Electrochemical Mechanical Polishing of 4H-SiC Using Ce Thin Film," ECS Journal pf Solid State Science Ecs J. Solid State Sci. Technol, vol. 9, No. 3, Jan. 1, 2020 (Jan. 1, 2020), p. 34002, XP 055974263.

Daiki Nagatomo et al., "Electrochemical and Abrasive-Free Finishing Process for SiC Single-Crystal Wafer", Department of Mechanical Engineering, Graduate School of Science and Engineering, Kindai University, Japan, pp. 704-708.

* cited by examiner

SURFACE PROCESSING APPARATUS AND SURFACE PROCESSING METHOD FOR SiC SUBSTRATE

CROSS-REFERENCE TO RELATED APPLICATION

This application is based on and claims the benefit of priority from earlier Japanese Patent Application No. 2021-087582 filed May 25, 2021, the description of which is incorporated herein by reference.

BACKGROUND

Technical Field

The present disclosure relates to a surface processing apparatus and a surface processing method for SiC substrates.

Related Art

A polishing method using anodization is known that can efficiently produce a difficult-to-process material, such as single crystal SiC, into a target shape having a scratch-free and damage-free high-quality surface. Specifically, this known polishing method includes an anodizing process and a polishing process. The anodizing process is a process for forming an oxide film is on the surface of a workpiece by applying a voltage to the workpiece as an anode in the presence of an electrolyte to produce a current flow of a predetermined current density. The polishing process is a process for selectively polishing and removing the oxide film by using a polishing material having a Mohs hardness that is an intermediate hardness between that of the workpiece and that of the oxide film. In the above known polishing method, the anodizing process and the polishing process are simultaneously progressed to planarize the surface of the workpiece. Such a technique is referred to as ECMP. ECMP stands for electro-chemical mechanical polishing.

DESCRIPTION OF SPECIFIC EMBODIMENTS

In conventional ECMP in which a SiC substrate is used as a workpiece, as disclosed in JP 2017-92497, the inventors have found that even if the current density is increased to increase the processing speed, there is a problem that the increase in the processing speed is limited because the oxidation rate in anodization saturates.

In view of the foregoing, it is desired to have a technique that can realize superior processing characteristics than those in the past, for example, in a surface processing apparatus and a surface processing method of a SiC substrate using anodization.

A surface processing apparatus for a SiC substrate according to an aspect of the disclosure includes: a surface processing pad including a grinding wheel layer disposed facing a workpiece surface of the SiC substrate; and a power supply device that passes a pulsed current having a period greater than 0.01 seconds and less than or equal to 20 seconds for anodizing the workpiece surface to be processed by the grinding wheel layer through the SiC substrate as an anode in the presence of an electrolyte.

A surface processing method for a SiC substrate according to another aspect of the disclosure includes: anodizing a workpiece surface of the SiC substrate by passing a pulsed current having a period greater than 0.01 seconds and less than or equal to 20 seconds through the SiC substrate as an anode in the presence of an electrolyte; and disposing a grinding wheel layer of a surface processing pad to face the workpiece surface and selectively removing, with the grinding wheel layer, an oxide generated on the workpiece surface through anodization.

Embodiments

Embodiments of the present disclosure will now be described with reference to the drawings. It should be noted that various modifications applicable to one embodiment may interfere with the understanding of the embodiment if the modifications are inserted in the middle of a series of descriptions of the embodiment. Therefore, the modifications will not be inserted in the middle of the series of description of the embodiment, but will be collectively described after the embodiment.

Surface Processing Apparatus

Figure 1:
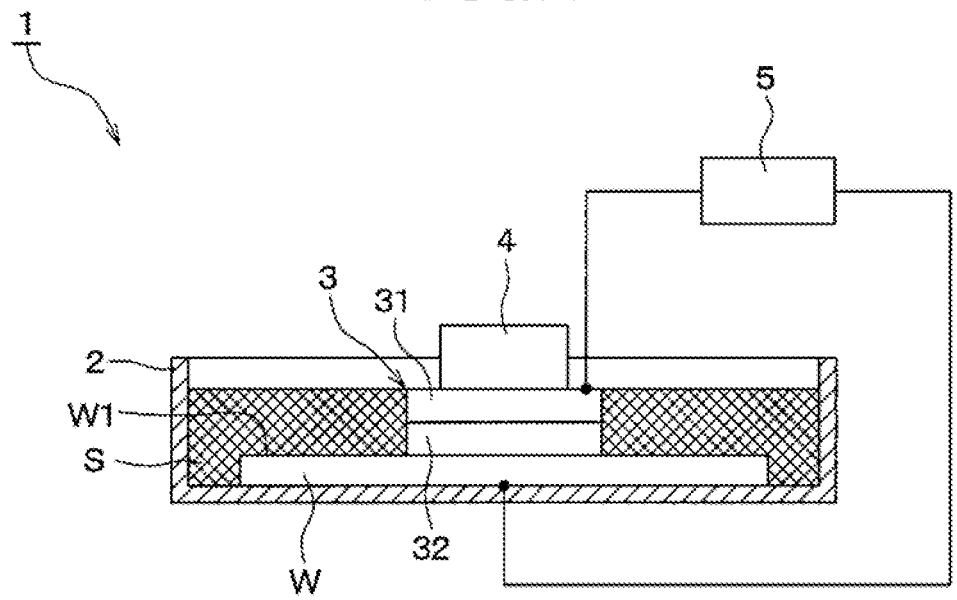
FIG. 1 is a schematic configuration diagram of a surface processing apparatus for implementing a surface processing method according to an embodiment of the present disclosure.

Referring to FIG. 1, a surface processing apparatus 1 according to the present embodiment is a processing apparatus that processes a single crystal SiC wafer or SiC substrate W as a workpiece, and is capable of polishing or grinding processing using anodization on the workpiece surface W1 of the SiC substrate W. That is, the surface processing apparatus 1 has the configuration of an ECMP apparatus or an ECMG apparatus. ECMG stands for electrochemical mechanical grinding.

The surface processing apparatus 1 includes a container 2, a surface processing pad 3, a driving device 4, and a power supply device 5. In the present embodiment, the container 2 can hold the SiC substrate W while the SiC substrate W is immersed in an electrolyte S containing no etchant component. The etchant component is a component (for example, hydrofluoric acid or the like) constituting a solution having a dissolving ability of an oxide film (i.e., SiC oxide formed into a film) formed on the workpiece surface W1 by anodization. The electrolyte S is an aqueous solution of, for example, sodium chloride, potassium chloride, or sodium nitrate.

The surface processing pad 3 includes an electrode 31 and a grinding wheel layer 32. The electrode 31 is a plate-like member composed of a good conductor, such as metal, and is formed of, for example, a copper plate. The grinding wheel layer 32 is joined to the electrode 31. That is, the surface processing pad 3 has a configuration in which the electrode 31 and the grinding wheel layer 32 are joined in the thickness direction of the surface processing pad 3. The grinding wheel layer 32 has a polishing material having a Mohs hardness that is an intermediate hardness between that of single crystal SiC and an oxide film of the single crystal SiC. That is, the grinding wheel layer 32 is rotated by the driving device 4 while being disposed facing the workpiece surface W1 of the SiC substrate W, so that the oxide film formed on the workpiece surface W1 by anodization can be selectively removed by polishing or grinding. In the present embodiment, the surface processing pad 3 is provided so that the grinding wheel layer 32 is disposed facing the workpiece surface W1 of the SiC substrate W across the electrolyte S.

The driving device 4 rotates the surface processing pad 3 about a predetermined rotation axis parallel to the thickness direction, and relatively shifts the SiC substrate W and the surface processing pad 3 in an in-plane direction orthogonal to the rotation axis. The power supply device 5 applies a voltage by using the SiC substrate W, which is the workpiece, as an anode and the electrode 31 in the surface processing pad 3 as a cathode in the presence of the electrolyte S, to pass a current for anodizing the workpiece surface W1, which is to be processed by the grinding wheel layer 32. In the present embodiment, the power supply device 5 is provided so that a pulsed current having a period greater than 0.01 seconds and less than or equal to 20 seconds is applied (that is, the pulsed current is made to flow between the SiC substrate W and the electrode 31).

Outline of Surface Processing Method of Embodiment

The surface processing apparatus 1 according to the present embodiment is capable of performing a surface processing method (that is, a polishing method or a grinding method) of the SiC substrate W having the following processing in order to achieve the processing characteristics (for example, processing speed or flatness) superior to those of the conventional ECMP. The anodization in (2) and the selective removal of the oxide film in (3) can be performed simultaneously or sequentially.

(1) The surface processing pad 3 is disposed facing the workpiece surface W1 of the SiC substrate W across the electrolyte S.

(2) The workpiece surface W1, which is to be processed by the grinding wheel layer 32, is anodized by passing a pulsed current having a period greater than 0.01 seconds and less than or equal to 20 seconds through the SiC substrate W as an anode in the presence of the electrolyte S.

(3) The workpiece surface W1 that has been anodized by the application of the pulsed current is ground or polished by the grinding wheel layer 32 to selectively remove an oxide film (i.e., an oxide formed into a film) on the workpiece surface W1.

Figure 2:
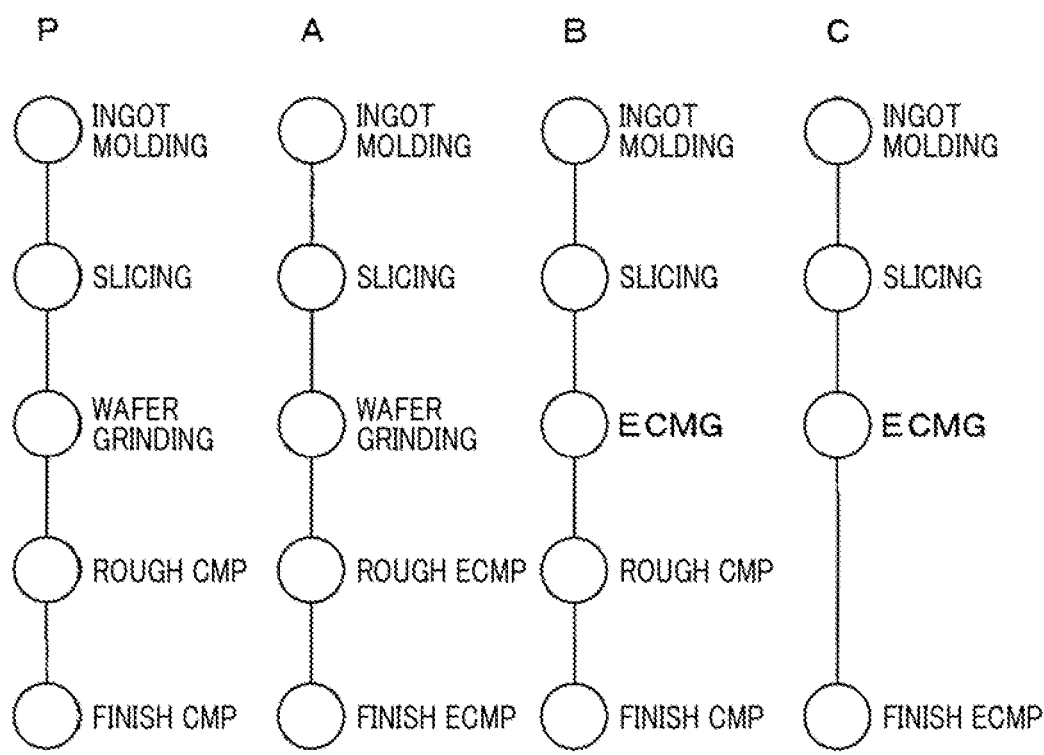
FIG. 2 illustrates the outline of a SiC wafer manufacturing process that can be accomplished by using the surface processing apparatus illustrated in FIG. 1.

FIGS. 2A to 2C are schematic manufacturing process diagrams of a SiC wafer or a SiC substrate W using the surface processing apparatus 1 illustrated in FIG. 1. The conventional manufacturing method P as a comparative example illustrated FIG. 2 indicates the outline of a manufacturing process of a SiC wafer in which well-known CMP is used in place of ECMP or ECMG by the surface processing apparatus 1 illustrated in FIG. 1. CMP stands for chemical mechanical polishing.

An outline of the conventional manufacturing method P will now be described. The conventional manufacturing method P includes an ingot molding process, a slicing process, a wafer grinding process, a rough CMP process, and a finish CMP process in this order. The ingot molding process is for growing a lump of single crystal SiC and forming the lump into a cylindrical ingot. The slicing process is of obtaining a thin discoid SiC substrate W or SiC wafer from an ingot by wire slicing. The wafer grinding process is for planarizing the SiC substrate W by removing, by grinding, the "undulation" in the SiC substrate W that occurs in the slicing process. The rough CMP process and the finish CMP process are for processing the workpiece surface W1 of the SiC substrate W into a mirror surface, which is a surface state preferable for a semiconductor device manufacturing process.

In general, in the wafer grinding process, a "damaged layer" having a certain degree of "subsurface damage" is formed on the workpiece surface W1 of the SiC substrate W and its vicinity. The "subsurface damage" is, for example, cracking, residual stress, etc. First, the workpiece surface W1 is mirror-finished in the rough CMP process. The damaged layer is removed by the subsequent finish CMP process.

As disclosed in JP 2017-92497 A, ECMP, which is a damage-free polishing process, achieves a processing speed higher than that of CMP. Thus, by replacing the CMP process with the ECMP process, high-speed and damage-free polishing of the workpiece surface W1 can be accomplished. In the ECMP process, a soft grinding wheel containing relatively soft abrasive grains (e.g., coria abrasive grains) is used as the grinding wheel layer 32.

Thus, in the present embodiment, for example, as in the manufacturing method A illustrated in FIG. 2, it is possible to replace the rough CMP process in the conventional manufacturing method P with a rough ECMP process, and to replace the finish CMP process in the conventional manufacturing process P with a finish ECMP process. In this way, the manufacturing cost can be reduced by approximately 40% compared with that of the conventional manufacturing method P.

The ECMG process can be accomplished by using a hard grinding wheel containing relatively hard abrasive grains (for example, diamond abrasive grains) as the grinding wheel layer 32. That is, as in the manufacturing method B illustrated in FIG. 2, the wafer grinding process in the conventional manufacturing method P can be replaced with the ECMG process. In this way, the manufacturing cost can be reduced by approximately 20% compared with that of the conventional manufacturing method P.

The ECMG process, which is a low-damage grinding process, reduces the frequency of subsurface damage compared with the wafer grinding process of the conventional manufacturing method P. Thus, when the wafer grinding process in the conventional manufacturing method P is replaced with the ECMG process, the manufacturing method B can be changed to the manufacturing method C. In the manufacturing method C, the rough CMP process in the conventional manufacturing method P is omitted and the finish CMP process in the conventional manufacturing method P is replaced with the finish ECMP process. In this way, the manufacturing cost can be reduced to approximately half of that of the conventional manufacturing method P.

Improvement of Oxidation Rate by Current Pulsing

In the conventional ECMP in which a SiC substrate is used as a workpiece, the inventors have found that even if the current density is increased to increase the processing speed, there is a problem that the increase in the processing speed is limited because the oxidation rate in anodization saturates. According to the examination by the inventors, the cause of the saturation of the increase in the oxidation rate accompanying the increase in the current density is considered to be a shortage in the supply of reactive species, that is, OH—, in the electrolyte S in the vicinity of the workpiece surface W1. The region in the vicinity of the workpiece surface W1 is hereinafter referred to as "near-surface region."

Specifically, the consumption of OH— by anodization in the near-surface region causes a decrease in the OH— concentration. Then, OH— is supplied from a bulk region of the electrolyte S, that is, a region farther from the workpiece surface W1 than the near-surface region, to the near-surface region according to the principle of material diffusion. Thus, the OH— concentration in the near-surface region decreases as it approaches the workpiece surface W1 according to Fick's law.

Whether or not the supply of OH— in the near-surface region is sufficient depends on the relationship between the oxidation rate, i.e., the consumption rate of OH—, and the supply rate of OH— from the bulk region. In this regard, in the conventional ECMP in which the current condition of anodization is direct current and constant current, an insufficient supply rate of OH— causes an insufficient supply of OH— in the near-surface region.

The inventors found that the oxidation rate is improved by making the applied current for anodization into a pulsed current having an on-time and an off-time, and supplying OH— from the bulk region to the near-surface region during the off-time to recover the OH— concentration in the near-surface region. Here, the "off-time" refers to a time when the current is substantially zero. The inventors also found that by setting the off-time relatively short (specifically, for example, about 0.01 to 10 seconds), it is possible to satisfactorily avoid an increase in the total processing time while maintaining a satisfactory oxidation rate during the on-time.

Figure 3:
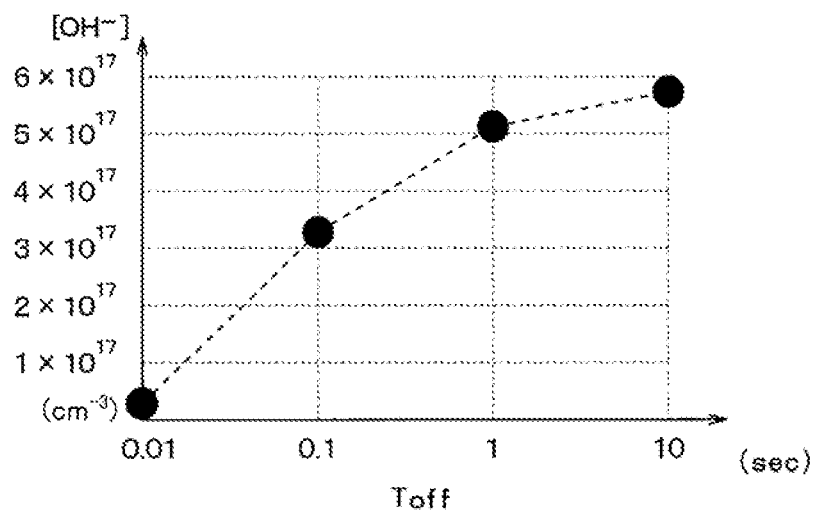
FIG. 3 is a graph illustrating simulated results of the effect of pulsing of an applied current on the recovery of OH— concentration during anodization in a region near a surface of a SiC wafer to be processed.

FIG. 3 is a result of a computer simulation showing the effect on the recovery of OH— concentration in the near-surface region by providing an off-time for the anodizing current. Here, the term "anodizing current" refers to an applied current for anodizing, that is, the portion of a current flowing into the SiC substrate W from the power supply device 5 that is actually used for the anodization of the workpiece surface W1, not for the electrolysis of the electrolyte S. In the drawing, "Toff" on the horizontal axis indicates the length of the off-time. The vertical axis indicates the OH— concentration at a position 10 μm away from the workpiece surface W1, which is presumed to be a flat surface. The preconditions of the simulation are as follows:

Diffusion coefficient $D=1.9\times10^{-9}$ m²/s

Bulk region OH-concentration $C=6.02\times10^{17}$ cm$^{-3}$

Figure 4:
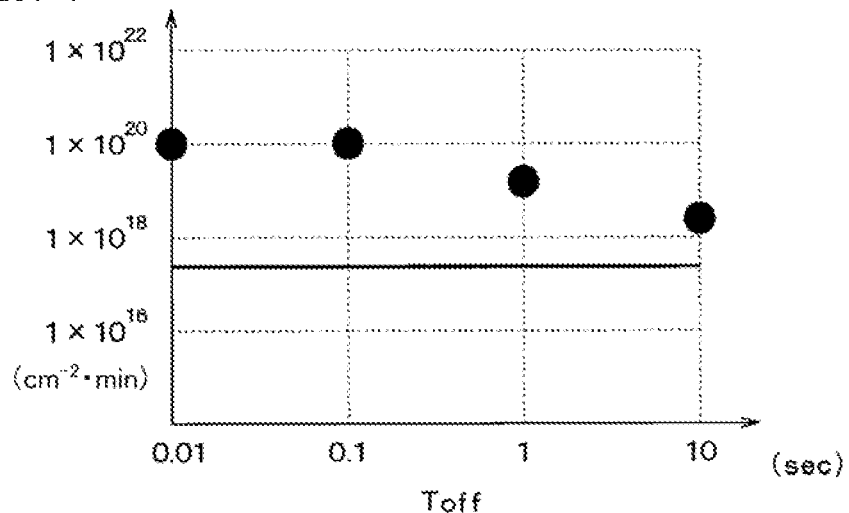
FIG. 4 is a graph illustrating the result of the trial calculation of the total amount of OH— reaction per unit time based on the simulation results illustrated in FIG. 3.

FIG. 4 illustrates the result of the trial calculation of the total amount of OH-reaction per unit time based on the simulation results illustrated in FIG. 3. The horizontal solid line in the drawing indicates a case of Toff=0, that is, direct current and constant current. The term "direct current and constant current" is hereinafter simply referred to as "constant current."

As it is apparent from FIGS. 3 and 4, the supply shortage of OH— in the near-surface region can be satisfactorily eliminated by providing an off-time of 0.01 seconds or more using the anodizing current as a pulsed current. Specifically, as illustrated in FIGS. 3 and 4, the inventors have confirmed through simulation that it is possible to satisfactorily supply OH— to the near-surface region in the off-time of 0.01 seconds or more and 10 seconds or less. However, the effect of the recovery of the OH— concentration by providing the off-time tends to saturate in a region where Toff is relatively long. Thus, it is considered more preferable that the off-time be approximately 0.1 to 1 second.

Figure 5:
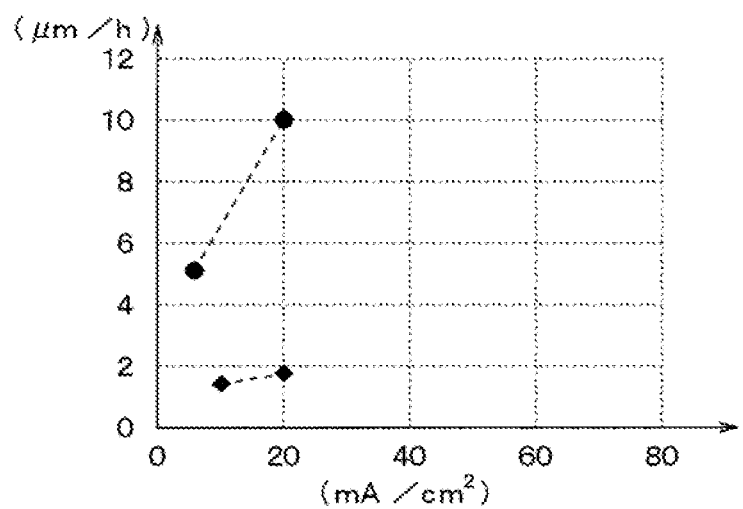
FIG. 5 is a graph illustrating experimental results to confirm the increase in the oxidation rate in anodization by pulsing of the applied current.

The inventors conducted an experiment using a 30-mm square wafer to confirm the difference in the oxidation rate in anodization between the constant current application and the pulsed current application. The pulsed current has a rectangular waveform with an on-time of one second and an off-time of one second (that is, a cycle of two seconds and a duty ratio of 0.5). After the anodizing treatment, the oxide film was removed with hydrofluoric acid, and the oxidation rate was calculated by the amount of oxide removed. The experimental results are illustrated in FIG. 5. In FIG. 5, the plotted circle points represent the case of a pulsed current and the plotted rhomboid points represent the case of a constant current. The value of the current density in the case of the pulsed current is the value during the on-time.

As is apparent from FIG. 5, in the case of a constant current, a high oxidation rate cannot be achieved even at a high current density of 10 mA/cm² or more. In contrast, in the case where a pulsed current is applied, a high oxidation rate is achieved within the range of high to low current density regions. As the current density increases, the oxidation rate also increases. Thus, when a pulsed current is applied, the processing speed can be satisfactorily increased by increasing the current density. In particular, even if a large amount of OH— in the near-surface region is consumed by applying a current having a high current density, the OH— concentration in the near-surface region can be satisfactorily recovered during the off-time. Thus, by applying a pulsed current, it is expected that high-speed processing can be achieved by applying a current having a high current density.

Improvement of Processing Speed by Current Pulsing

The processing speed is affected not only by the oxidation rate but also by the properties of the oxide film. Specifically, in the conventional ECMP, an oxide film having a relatively high density and a relatively high hardness is formed by applying a constant current having a relatively low current density. When the composition of the oxide film formed by the application of a constant current corresponding to the conventional ECMP was analyzed by an XPS apparatus, the oxide film contained approximately 40% SiOC, approximately 30% SiO, and approximately 10% $Si_2O_3$. XPS stands for X-ray photoelectron spectroscopy.

In contrast, when the composition of the oxide film formed by the application of a pulsed current was analyzed by an XPS apparatus, the content of SiOC was significantly lower than that of the oxide film formed by the application of a constant current, while the content of SiO was significantly higher. When the cross-section was observed with a transmission electron microscope, the formation of an internal void layer was more significant in the oxide film formed by the application of a pulsed current than in the oxide film formed by the application of a constant current. There was a tendency in that an increase in the pulse period led to an increase the number of voids in the void layer. Specifically, under the condition of a duty ratio of 0.5, the generation of a void layer was more significant in the case of a constant current even in the case of a period of 0.02 seconds, and the amount of the voids increased as the period increased, for example, from 0.1 seconds to one second. That is, the inventors confirmed that an oxide film that can be easily polished or ground at a relatively low density was formed within a period of 0.02 to 1 second.

In consideration of the above results, the following matters are considered as the effects of the pulsed current application. Since OH— is satisfactorily supplied to the near-surface region and the anodization of SiC is promoted, more SiO with a more progressed degree of oxidation than that of SiOC is generated. As the degree of oxidation progresses in the order of SiOC and SiO, the expansion coefficient becomes larger, and the generation of voids due to internal stress in the oxide film is promoted. Thus, the formation of the void layer caused by the difference in the expansion coefficient before and after oxidation becomes more significant as a result of more SiO being generated. In this way, the oxide film containing a large amount of SiO and having an increased number of voids in the void layer has low hardness, and the speed of grinding or polishing increases. When many cracks occur on the surface of the oxide film due to the generation of voids, OH—, which is a reactive species, enters the inside of the film through the cracks, and the anodization may be further promoted. As described above, an effect of increasing the polishing speed can be expected as an effect of the pulsing of the applied current.

Figure 6:
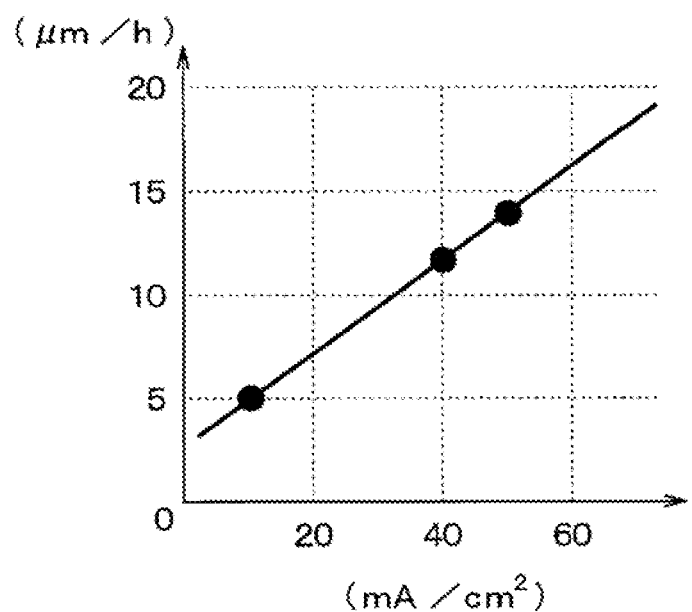
FIG. 6 is a graph illustrating the relationship between the current density and the processing speed when a pulsed current is applied.
Figure 7:
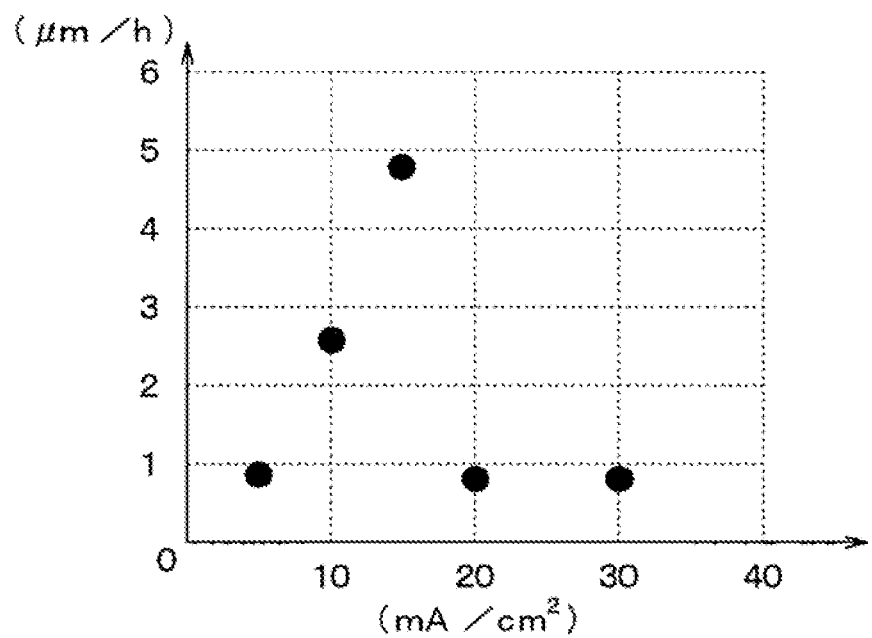
FIG. 7 is a graph illustrating the relationship between the current density and the processing speed when direct current and constant current are applied as a comparative example.

FIGS. 6 and 7 illustrate the results of comparing the effect of increasing the polishing speed when the current density is increased between the case of applying a pulsed current and the case of applying a constant current. That is, FIG. 6 illustrates the relationship between the current density and the polishing speed when the current density in the application of a pulsed current is varied. The pulsed current has a period of two seconds and a duty ratio of 0.75. FIG. 7 illustrates the relationship between the current density and the polishing speed when the current density in the application of a constant current is varied. A 4-inch wafer was used as a polishing target. The method of calculating the polishing speed is as follows: Variation in the thickness of the 4-inch wafer, which is a sample, was measured at nine measurement points at equal intervals along the straight line passing through the center of the wafer surface before and after polishing, and the average value of the thickness variation in a unit time at the nine measuring points was calculated to be the polishing speed of the wafer.

As illustrated in FIG. 7, in the case of the constant current application, in the current density region of 15 $mA/cm^2$ or less, the polishing speed also increases as the current density increases. However, in the current density region of 20 $mA/cm^2$ or more, the polishing rate was lower than that in the case of 10 to 15 $mA/cm^2$, and the polishing speed was the same as that in the low current region of approximately 5 $mA/cm^2$. In contrast, as illustrated in FIG. 6, in the case of the pulsed current application, it was confirmed that the polishing speed increased with an increase in the current density even in a large current region of 40 $mA/cm^2$ or more.

Improvement of Flatness by Current Pulsing

As described above, in the case of the constant current application, it is difficult to recover the OH— concentration in the near-surface region. Thus, as the formation of the oxide film progresses, it becomes difficult to maintain the anodizing current. Specifically, for example, even when a predetermined voltage is applied in an attempt to achieve a constant current flow having a large value exceeding 10 $mA/cm^2$, the current value suddenly rises to a peak value corresponding to the target value and then suddenly falls significantly. Even under the current application conditions under which relatively stable anodization is presumed to be possible at 10 $mA/cm^2$ or less, a portion of the current flowing is used for electrolysis of the electrolyte S, not anodization. The ratio of the current supplied for anodization to the current supplied for electrolysis also varies with the decrease in OH— concentration in the near-surface region. When the anodizing current varies, the uniformity of the oxide film being formed is impaired.

In contrast, when a pulsed current is applied, the anodizing current can be satisfactorily maintained. The inventors have confirmed that a very satisfactory current maintenance effect can be achieved with a period of 0.1 seconds or more, in particular. Thus, by maintaining a stable anodizing current by pulsing the applied current, the uniformity of the oxide film can be improved, and the flatness, i.e., the TTV can be expected to be improved. TTV stands for total thickness variation.

Figure 8:
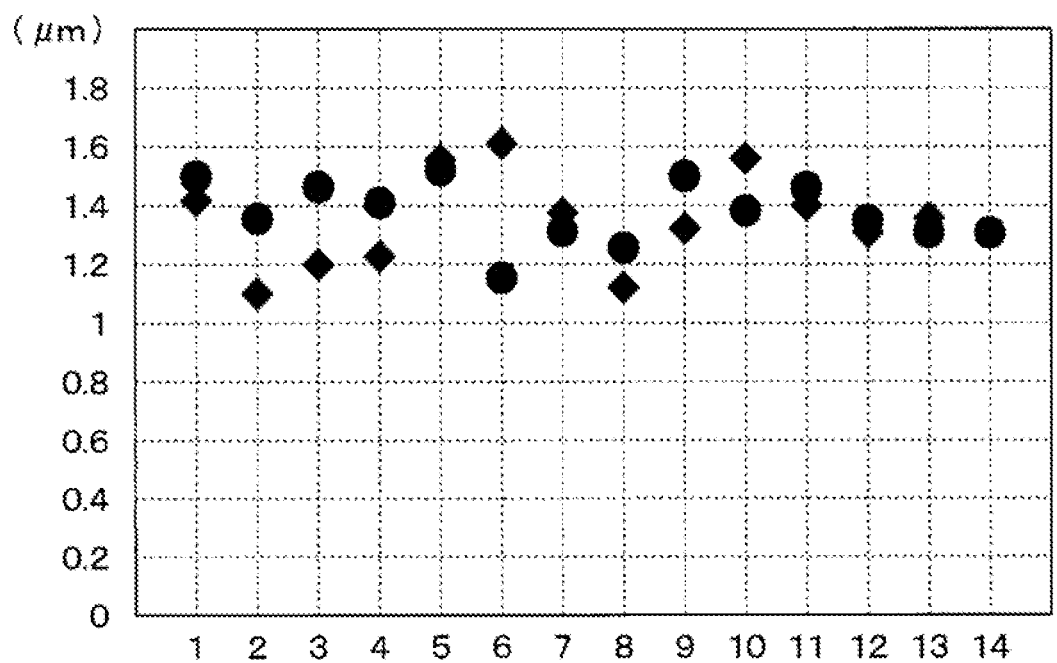
FIG. 8 illustrates a result of evaluating the uniformity of an oxide film on a workpiece surface when a pulsed current is applied.
Figure 9:
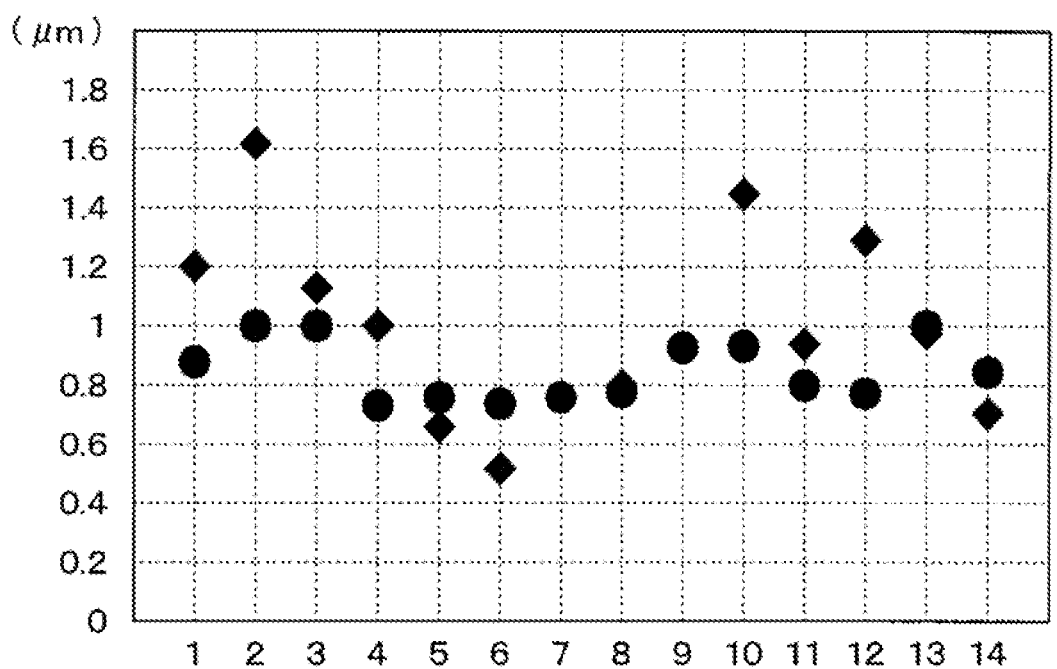
FIG. 9 is a diagram illustrating the results of evaluating the uniformity of an oxide film on a workpiece surface when direct current and constant current are applied as a comparative example.

FIG. 8 illustrates the result of evaluating the uniformity of the oxide film in the case of the pulsed current application. FIG. 9 illustrates the result of evaluating the uniformity of the oxide film in the case of the constant current application as a comparative example. The current application conditions are as follows:

Constant current: voltage 50 V (equivalent to a current density of 20 $mA/cm^2$), current applied for 40 minutes Pulsed current: voltage 50 V (equivalent to a current density of 20 $mA/cm^2$), period of 0.5 seconds, duty ratio of 0.5, current applied for 20 minutes The evaluation method is as follows: A first masking tape was linearly applied on the surface of the wafer before the anodizing process so that the applied masking tape passes through the center of the wafer. Next, a second masking tape was linearly applied so as to pass through the center of the wafer and be orthogonal to the first masking tape. In this way, the surface of the wafer before the anodizing process was anodized while the two masking tapes were applied orthogonal to each other to form a substantially "X" shape.

No oxide film is formed by anodization in the regions to which masking tape was applied. Thus, when the masking tapes were peeled off after the anodization, bumps were formed due to the absence of the oxide film in the regions to which the masking tapes have been applied and the presence of the oxide film in the adjacent regions. By measuring the height of these bumps at multiple measurement points, it is possible to evaluate the uniformity of the thickness of the oxide film.

The unoxidized portion corresponding to the region to which the first masking tape was applied is referred to as a "first line," and the unoxidized portion corresponding to the region to which the second masking tape was applied is referred to as a "second line." In each of the first line and the second line, the height of the bumps was measured at 14 measurement points at equal intervals. In FIGS. 8 and 9, the numbers 1 to 14 on the horizontal axis indicate measurement points on the lines. The plotted rhomboid points represent the measurement results on the first line, and the plotted circle points represent the measurement results on the second line. As it is apparent from FIGS. 8 and 9, the uniformity of the thickness of the oxide film was improved by the pulsed current application. By applying a pulsed current, a flatness of TTV=1.756 μm after polishing was also achieved.

Pulse Period

Figure 10:
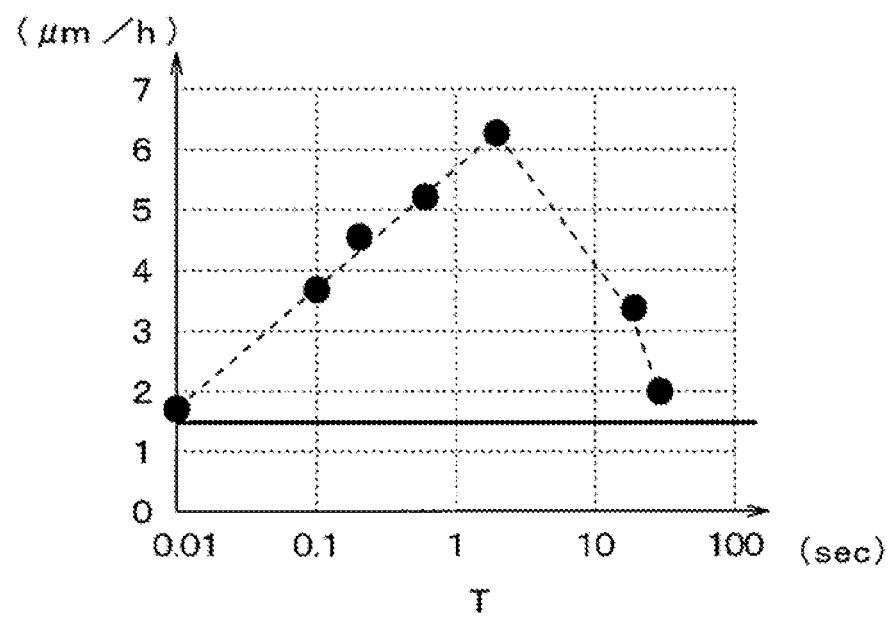
FIG. 10 is a graph illustrating the relationship between the period and the oxidation rate when a pulsed current is applied.

FIG. 10 illustrates a change in the oxidation rate when the period of the pulsed current is changed. In the drawing, the vertical axis indicates the oxidation rate, and the horizontal axis T indicates the period. A horizontal solid line in the drawing indicates a value in the case of a constant current as a comparative example.

The evaluation conditions are as follows: A 4-inch wafer was used as a sample. The duty ratio, the current density, and the application time were made the same in order to match the charge amount between the respective current application conditions. The duty ratio was 0.5, and the current density was 20 mA/cm$^2$.

As is apparent from FIG. 10, an oxidation rate higher than that of the constant current was obtained within a period range of at least 0.01 to 20 seconds. Here, as described above, in order to recover the OH— concentration in the near-surface region, it is necessary to provide an off-time of 0.01 seconds or more. Thus, the period for obtaining a satisfactory oxidation rate is greater than 0.01 seconds and 20 seconds or less. In particular, when the period is 0.01 seconds, the off-time is 0.005 seconds, so the oxidation rate is slightly higher than that of the case of a constant current. Thus, for example, if the duty ratio is 0.25 to 0.75 at the minimum value of 0.01 seconds of the off-time as described below, the minimum value of a suitable period is approximately 0.02 seconds.

As described above, in consideration of the excellent processability due to the formation of the low-density oxide film, the period is preferably within the range of 0.02 to 1 second. As illustrated in FIG. 10, in the region in which the period exceeds 20 seconds, the oxidation rate is slightly higher than in the case of a constant current. It is considered that the reason for this is that while the effect on an increase in the oxidation rate by providing an off-time is saturated as described above, the overall cycle time is prolonged. Thus, in consideration of the simulation results illustrated in FIGS. 3 and 4, the evaluation results of the actual oxidation rate illustrated in FIG. 10, and the cycle time in the actual manufacturing process, it is preferable that the period is 0.1 seconds or more and 2 seconds or less.

In comprehensive consideration of the above, a preferred period is 0.02 to 2 seconds, more preferably 0.02 to 2 seconds, more preferably 0.02 to 1 second or 0.1 to 2 seconds, and most preferably 0.1 to 1 second.

Duty Ratio

Figure 11:
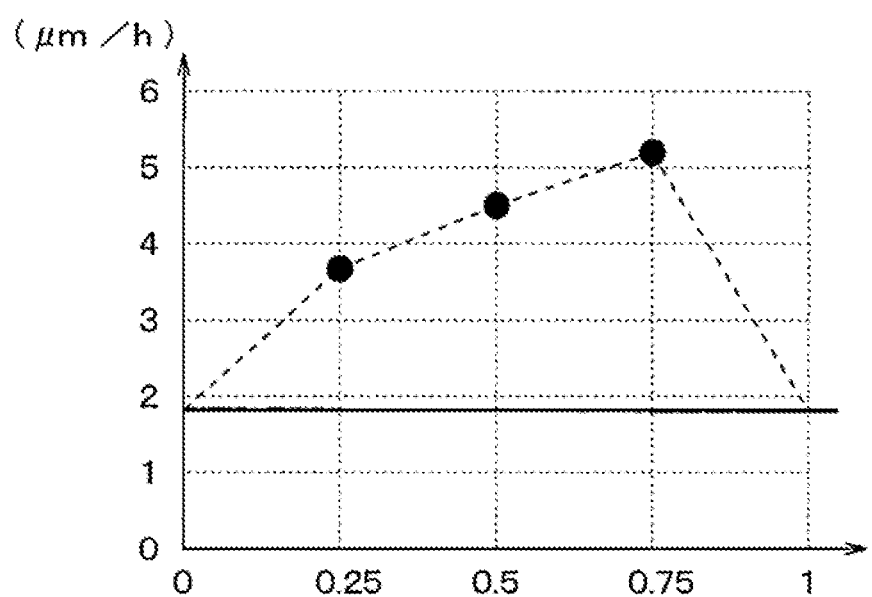
FIG. 11 is a graph illustrating the relationship between the duty ratio and the oxidation rate when a pulse current is applied.

FIG. 11 illustrates a change in the oxidation rate when the duty ratio of the pulsed current is changed. In the drawing, the vertical axis indicates the oxidation rate, and the horizontal axis T indicates the duty ratio. A horizontal solid line in the drawing indicates a value in the case of a constant current as a comparative example.

The evaluation conditions are as follows: A 4-inch wafer was used as a sample. In order to match the charge amount between the respective current application conditions, the current densities were set to be the same (i.e., 20 mA/cm$^2$), and the application time was adjusted so that the product of the duty ratio and the application time was constant. As illustrated in FIG. 11, by setting the duty ratio within the range of 0.25 to 0.75, a satisfactory oxidation rate higher than the constant current was achieved.

Summary of Effects of Current Pulsing

As described above, pulsation of the applied current in the anodization can lead to not only an increase in the oxidation, but also improvement in the ease of polishing and grinding associated with the decrease in the density and the hardness of the oxide film, and improvement in the flatness by improvement in the uniformity of the oxide film. Thus, the speed of polishing or grinding can be increased, and the wafer manufacturing cost can be reduced.

Regarding the wafer size, it is possible to achieve a similar polishing speed even when the diameter is further increased from four inches as in the above-described embodiment. Specifically, the surface processing method according to the present embodiment is satisfactorily applicable to a wafer size, for example, within the range of 1 to 8 inches.

Modifications

The present disclosure is not limited to the above embodiments. Therefore, the above embodiments can be modified as appropriate. Typical modifications will be described below. In the following description of the modifications, differences from the above embodiment will be mainly described. In the above-described embodiments and the modifications, the same reference numerals are assigned to portions that are the same or equal to each other. Therefore, in the description of the following modifications, the description of the above-described embodiments may be appropriately incorporated with respect to components having the same reference numerals as those of the above-described embodiments, unless there is a technical contradiction or a special additional description.

The present disclosure is not limited to the specific device configuration described in the above embodiments. That is, FIG. 1 is a simplified schematic diagram for simply explaining the outline of the surface processing apparatus 1 according to the present disclosure and the surface processing method that can be performed by the apparatus 1. Therefore, the configuration of the surface processing apparatus 1 actually manufactured and sold does not necessarily match the exemplary configuration illustrated in FIG. 1. The configuration of the surface processing apparatus 1 actually manufactured and sold can be appropriately modified from the exemplary configuration illustrated in FIG. 1.

For example, the configuration of the surface processing pad 3 is not limited to the specific device configuration described in the above embodiment. Specifically, the electrode 31 and the grinding wheel layer 32 need not be joined in the thickness direction of the surface processing pad 3. More specifically, for example, the electrode 31 and the grinding wheel layer 32 may be disposed adjacent to each other in the in-plane direction orthogonal to the thickness direction of the surface processing pad 3. That is, the surface processing apparatus 1 may have a configuration in that the surface processing pad 3 rotates or moves such that the electrode 31 and the surface processing pad 3 alternately face a specific portion of the workpiece surface W1 in time. Alternatively, the electrode 31 may be a separate body from the surface processing pad 3. That is, the surface processing apparatus 1 may have a configuration in that the rotates or moves such that the electrode 31 and the surface processing pad 3 alternately face a specific portion of the workpiece surface W1 in time. The type of abrasive grains contained in the grinding wheel layer 32 is not particularly limited.

The electrolyte S may contain an etchant component. That is, the surface processing apparatus 1 according to the present disclosure and the surface processing method that can be performed by the surface processing apparatus 1 may be one in which the workpiece surface W1 is polished or ground by selectively removing the oxide film generated by the anodization using both the etchant and the surface processing pad 3.

The surface processing apparatus 1 according to the present disclosure and the surface processing method that can be performed by the surface processing apparatus 1 are typically applicable to any of the ECMG process, the rough ECMP process, and the finish ECMP process in the manufacturing methods A to C illustrated in FIG. 2. However, for example, in the manufacturing method A, it can be expected that the workpiece surface W1 after the rough ECMP process is satisfactorily mirror-finished and has minor subsurface damage caused by the rough ECMP process. Thus, it is possible to use the ECMP with the conventional constant current application for the finish ECMP process.

It is obvious that the elements constituting the above-described embodiments are not necessarily essential unless it is specifically indicated that they are essential or they are clearly essential in principle. The present disclosure is not limited to the specific numerical values unless the numerical values such as the number, quantity, and range of the components are referred to, the specific numerical values are specifically indicated to be essential, and the specific numerical values are clearly limited in principle. Similarly, the present disclosure is not limited to the shapes, directions, positional relationships, etc., of the components unless when the shapes, directions, positional relationships, etc., of the components are referred to, when it is specifically indicated that they are essential, and when they are limited to a specific shape, direction, positional relationships, etc., in principle.

The modifications are not limited to the above examples. That is, for example, multiple embodiments besides those illustrated above may be combined with each other as long as they do not technically contradict each other. Similarly, multiple modifications may be combined with each other as long as they do not technically contradict each other.

What is claimed is:

1. A surface processing apparatus for a SiC substrate, comprising:
   a surface processing pad including a grinding wheel layer disposed facing a workpiece surface of the SiC substrate; and
   a power supply device that passes a pulsed current having a current density of 10 mA/cm$^2$ or more and a period greater than 0.01 seconds and less than or equal to 20 seconds for anodizing the workpiece surface to be processed by the grinding wheel layer through the SiC substrate as an anode in an electrolyte.

2. A method of processing a surface of a SiC substrate, comprising:
   anodizing a workpiece surface of the SiC substrate by passing a pulsed current having a current density of 10 mA/cm$^2$ or more and a period greater than 0.01 seconds and less than or equal to 20 seconds through the SiC substrate as an anode in an electrolyte; and
   disposing a grinding wheel layer of a surface processing pad to face the workpiece surface and selectively removing, with the grinding wheel layer, an oxide generated on the workpiece surface through anodization.

3. The method according to claim 2, wherein the pulsed current has an off-time and an on-time, the off-time greater than 0.01 seconds and less than or equal to 10 seconds.

4. The method according to claim 2, wherein the period is within a range of 0.02 to 1 second.

5. The method according to claim 2, wherein the period is 0.1 seconds or more.

6. The method according to claim 2, further comprising:
   performing, simultaneously or sequentially, the anodization of the workpiece surface and the selective removal of the oxide generated on the workpiece surface with the grinding wheel layer.

7. The method according to claim 6, wherein the grinding wheel layer grinds or polishes the workpiece surface anodized by application of the pulsed current.

8. The method according to claim 2, wherein
   the pulse current has an on-time time and an off-time that allows a concentration of reactive species in the electrolyte in the vicinity of the workpiece surface to recover from concentration of reactive species consumed during the on-time, and
   the grinding wheel layer rotates around an axis perpendicular to the workpiece surface of the SiC substrate.

* * * * *